United States Patent
Yuang et al.

(10) Patent No.: US 6,171,876 B1
(45) Date of Patent: Jan. 9, 2001

(54) SELF-ALIGNED METHOD FOR FABRICATING A RIDGE-WAVEGUIDE SEMICONDUCTOR LASER DIODE

(75) Inventors: Rong-Heng Yuang, Taipei; Chiu-Ling Chen, Hsinchu; Ming-Cheng Wang, Taoyuan, all of (TW)

(73) Assignee: Industrial Technology Research Institute

( * ) Notice: Under 35 U.S.C. 154(b), the term of this patent shall be extended for 0 days.

(21) Appl. No.: 09/186,191

(22) Filed: Nov. 4, 1998

(30) Foreign Application Priority Data

Jun. 18, 1998 (TW) ................................................ 87109771

(51) Int. Cl.⁷ ........................................................ H01L 21/00
(52) U.S. Cl. ................................. 438/22; 438/41; 438/38
(58) Field of Search ................................. 438/22, 41, 38, 438/129, 130

(56) References Cited

U.S. PATENT DOCUMENTS

| | | | |
|---|---|---|---|
| 5,293,392 | * 3/1994 | Shieh et al. ........................ | 438/22 |
| 5,474,954 | * 12/1995 | Yang ................................... | 438/129 |
| 5,504,768 | * 4/1996 | Park et al. .......................... | 438/41 |
| 5,658,823 | * 8/1997 | Yang ................................... | 438/38 |

* cited by examiner

Primary Examiner—David Nelms
Assistant Examiner—Dung Le
(74) Attorney, Agent, or Firm—Thomas, Kayden, Horstemeyer & Risley

(57) ABSTRACT

A self-aligned method for fabricating a ridge-waveguide semiconductor laser uses two photoresist layers in the process. The lower one is photoresist ODUR1013, and the upper one is photoresist AZ5214E. The lower photoresist layer, ODUR1013, can only be developed by light of wavelength less than 300 nm, and the upper photoresist layer, AZ5214E, can only be developed by light of wavelength greater than 300 nm. In the process of forming an opening on the top of the ridge structure, a G-line mask aligner is used to develop the upper photoresist AZ5214E and to expose the lower photoresist ODUR1013. Then, by performing a reactive ion etching (RIE) process, the lower photoresist ODUR1013 and the dielectric within the opening are removed. The remains of the upper photoresist layer, AZ5214E, are used to protect the sidewalls of the ridge structure in the RIE process.

38 Claims, 13 Drawing Sheets

SELF-ALIGNED METHOD FOR FABRICATING A RIDGE-WAVEGUIDE SEMICONDUCTOR LASER DIODE

CROSS-REFERENCE TO RELATED APPLICATION

This application claims the priority benefit of Taiwan application serial no. 87109771, filed Jun. 18, 1998, the full disclosure of which is incorporated herein by reference.

BACKGROUND OF THE INVENTION

1. Field of the Invention

This invention relates to the fabrication of a semiconductor laser, and more particularly, to a self-aligned method for fabricating a ridge-waveguide semiconductor laser diode.

2. Description of Related Art

The structure of a common ridge-waveguide laser diode is shown in FIG. 1A. The laser diode includes a substrate 100, such as a N-type substrate, and a first cladding and guiding layer 102, an active layer 104, a second cladding and guiding layer 106, a dielectric layer 108, and a cap layer 110 formed sequentially on the substrate 100. There are a metal layer 112, a P-type metal electrode, located on the cap layer 110, and another metal layer 114, a N-type metal electrode, located underneath the substrate 100. The waveguide structure of the laser consists of the active layer 104, the first cladding and guiding layer 102, and the second cladding and guiding layer 106. Because the refraction index of the active layer 104 is larger than that of these two cladding and guiding layers 102 and 106, the light generated by the recombination of carriers is then confined within the active layer 104.

Nowadays, double heterostructure (DH) is widely used in laser diodes. When the P-type electrode 112 is connected to a positive voltage and the N-type electrode is connected to a negative voltage, a consequent bias is generated. The consequent bias forces electrons from the N-type electrode, and the holes from the P-type electrode flow toward the active layer 104. The potential barrier generated in the active layer 104 resists the passing of those electrons and holes. As a result, the over-populated electrons and holes within the active layer 104 cause population inversion. The recombination of carriers releases light of the same energy and phase, also known as a laser, which is an acronym for light amplification by stimulated emission radiation. In the foregoing ridge-waveguide laser, current can only flow through the surface of the ridge. The dielectric layer located on the sides of the ridge structure guides the light wave efficiently to improve the electro-optic effect.

Referring to FIG. 1B, a ridge-waveguide laser of a double-channel structure 116 is shown. The first cladding and guiding layers 102 and 106 are further divided into cladding layers 102a and 106a, and guiding layers 102b and 106b. Then, as shown in FIG. 1B, an etching process is performed on the laser structure to form the double channel 116. A dielectric layer 108 is formed on the entire structure, and the dielectric layer 108 is patterned to form a contact opening that exposes the top of the cap layer 110. Then, a P-type metal electrode 112 is formed on the top of the substrate 100 and an N-type metal electrode 114 is formed underneath the substrate 100 to accomplish the structure of a ridge-waveguide laser diode.

Even though the foregoing method for forming a ridge-waveguide laser diode is simple, misalignment occurs in the step of forming the contact opening on the ridge structure 120, especially as the dimension of the ridge structure 120 is small. For example, in a case having a contact opening of a 2-μm width on the ridge-structure of a 3-μm width, the alignment tolerance on either side is only 0.5 μm. This is too tiny for existent fabrication processes. Furthermore, because the ridge structure 120 is not entirely covered by the metal layer 112, the resistance of ohmic contact is larger and the thermal radiation is worse. That is, the conventional method for fabricating a ridge-waveguide laser diode cannot provide a convenient and reliable fabrication process, and a high-performance laser diode at the same time.

There are a number of methods to resolve the foregoing problems of fabricating a ridge-waveguide laser, such as U.S. Pat. No. 4,728,628, U.S. Pat. No. 4,830,986, U.S. Pat. No. 5,059,552, U.S. Pat. No. 5,208,183, U.S. Pat. No. 5,474,954, U.S. Pat. No. 5,504,768, and U.S. Pat. No. 5,658,823.

As provided by the U.S. Pat. No. 5,504,768, a method includes forming a P-type metal layer, and using the P-type metal layer as a mask to form the ridge structure and the double channel, forming a dielectric layer on the substrate, and then, forming openings. Since the P-type metal layer covers the entire ridge structure, the problems of overheating and high resistance are resolved. However, the method has an alignment problem during the process of forming a narrow ridge structure.

There is another method described in U.S. Pat. No. 5,474,954 that applies a technique of self-alignment to from a current cutoff layer on the sidewall of the P-type metal for reducing the heat generated during lasing. As the integration of the laser diode is raised, an alignment problem still occurs in the fabrication process, and degrades the process yield.

In U.S. Pat. No. 4,728,628, a method that also uses a metal layer as a mask includes forming a dielectric layer after a ridge structure is formed, forming a P-type metal layer, and then, forming openings. The width of the opening is equal to the sum of the width of the double channel and the width of the ridge structure. A smaller opening whose width is equal to the width of the ridge structure is formed within the foregoing opening, and filled with metal. The method overcomes the alignment problem, but the absence of a dielectric layer on either sidewall of the ridge structure causes problems including peeling of devices and a poor reliability under a high working temperature.

Likewise, in U.S. Pat. No. 5,208,183, a method is provided to fabricate a ridge waveguide laser diode having a very narrow ridge waveguide. Even though the provided method resolves the alignment problem by eliminating critical alignment steps from the fabrication process, other problems such as overheating still exist. In addition, Since current can only flow through a limited cross section, the resistance of ohmic contact on the laser diode is extravagant.

Besides, as described in U.S. Pat. No. 5,658,823, a method is provided to protect the dielectric on either sidewall of the ridge structure. The provided method includes removing only a portion of the photoresist located on the top of the ridge structure and in the mean time, still keeping the photoresist in the double channel. Referring to FIGS. 2 and 3, property curves are used to explain the relationship between the remaining thickness of different photoresist and the exposure time. As shown in FIG. 2. the curve 200 shows the relationship between the remaining thickness of a photoresist AZ1500 and the time exposed under the G-line mask aligner, whose wavelength is about 300 nm and up. The photoresist AZ1500 is entirely removed by just being exposed to the G-line for 10 seconds. In other words, for every two seconds the photoresist AZ1500 is exposed to the G-line, a thickness of a couple thousand angstroms is removed.-line So, it is obvious that the processing rate of the photolithography process that uses AZ1500 and the G-line is too fast to control.

In FIG. 3, the curve 300 shows the relationship between the remaining thickness of a photoresist ODUR1013 and the time exposed under the I-line, whose wavelength is less than 300 nm. About 100 seconds of exposure time are required to remove all the photoresist, at a rate of about 1000–2000 Å per 10 seconds. Even though -linethe removal rate is slower, it is still difficult to control the photolithography process. Therefore, exposing the dielectric on the top of the ridge structure by removing the photoresist thereon is not a very practical method for the task of fabricating a ridge-waveguide semiconductor laser.

According to the foregoing, misalignment always exists in a conventional method for fabricating a ridge-waveguide semiconductor laser. A ridge-waveguide semiconductor laser made by the conventional method has undesirable properties, a large resistance, and overheating problem. Furthermore, the conventional method, such as the one provided by U.S. Pat. No. 4,729,628, also causes short circuit problems.

Moreover, because the thickness of photoresist and the exposure time are very difficult to control precisely, the dielectric located on the sidewalls of the ridge structure is easily removed. As a result, a metal layer formed by the follow-up process may not only cover the top of the ridge structure as designed, it possibly covers the bottom of the double channel as well. The presence of unexpected materials on the bottom of the double channel degrades the current flowing into the device.

SUMMARY OF THE INVENTION

It is therefore an objective of the present invention to provide a self-aligned method for fabricating a ridge-waveguide semiconductor laser to increase the yield and the stability of devices.

It is another objective of the present invention to provide a self-aligned method for fabricating a ridge-waveguide semiconductor laser to fabricate a laser with better properties, such as a lower resistance and a better heat-sinking ability.

It is still another objective of the present invention to provide a self-aligned method for fabricating a ridge-waveguide semiconductor laser to prevent the photoresist located on the bottom of the double channel from being over etched by utilizing two photoresist layers. The upper photoresist layer is used to form openings, and the lower photoresist layer is used to protect the dielectric located on the bottom of the double channel from being over etched.

In accordance with the foregoing and other objectives of the present invention, the method according to the invention is based on using two photoresist layers in the process of fabricating a ridge-waveguide semiconductor laser, wherein the lower one is photoresist ODUR1013, and the upper one is photoresist AZ5214E. The lower photoresist layer, ODUR1013, can only be developed by light having a wavelength less than 300 nm, and the upper photoresist layer, AZ5214E, can only be developed by light having a wavelength longer than 300 nm. In the process of forming an opening on the top of the ridge structure, a G-line mask aligner is used to develop the upper photoresist AZ5214E and to preserve the lower photoresist ODUR1013. Then, a reactive ion etching (RIE) process is performed to remove the lower photoresist ODUR1013 and the dielectric within the opening. The remains of the upper photoresist layer, AZ5214E, are used to protect the region outside the ridge structure in the RIE process.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a self-aligned method for fabricating a ridge-waveguide semiconductor laser diode includes applying a stack of two different photoresist layers. The sensitivities of the two applied photoresist layers ability of are different according to lights of different wavelengths. The lower photoresist layer used in a first embodiment of the invention includes ODUR1013, which only reacts to light having a wavelength less than 300 nm. In contrast, the upper photoresist layer used in the first embodiment of the invention includes AZ5214E, which only reacts to light having a wavelength longer than 300 nm. By using a G-line mask aligner to expose these two photoresist layers, an opening can be formed on the upper photoresist without affecting the lower photoresist layer. Then, by performing a reactive ion etching (RIE) process on the substrate, the lower photoresist layer and dielectric above the ridge are removed. The remains of the upper photoresist layer located outside the ridge are used as a protection in the RIE process.

Similarly, in a second embodiment of the invention, the lower photoresist layer used includes AZ5214E, which only reacts to light having a wavelength longer than 300 nm. In the mean time, the upper photoresist layer in the second embodiment of the invention includes ODUR1013, which only reacts to light having a wavelength less than 300 nm. By using an I-line mask aligner to expose these two photoresist layers, an opening can be formed on the upper photoresist without affecting the lower photoresist layer.

Figure 1A:
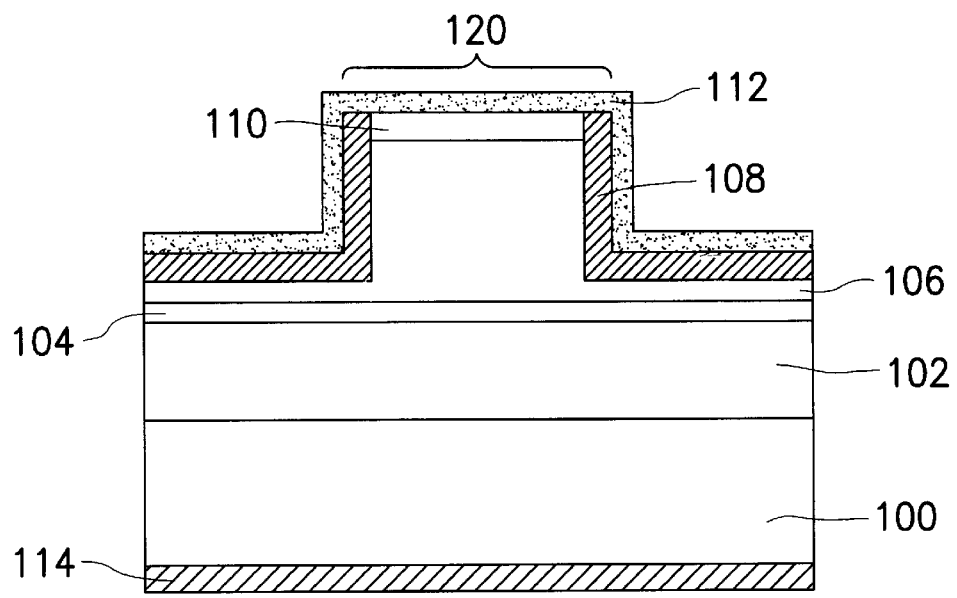
FIG. 1A is a cross-sectional view showing a portion of a common ridge-waveguide semiconductor laser diode.
Figure 1B:
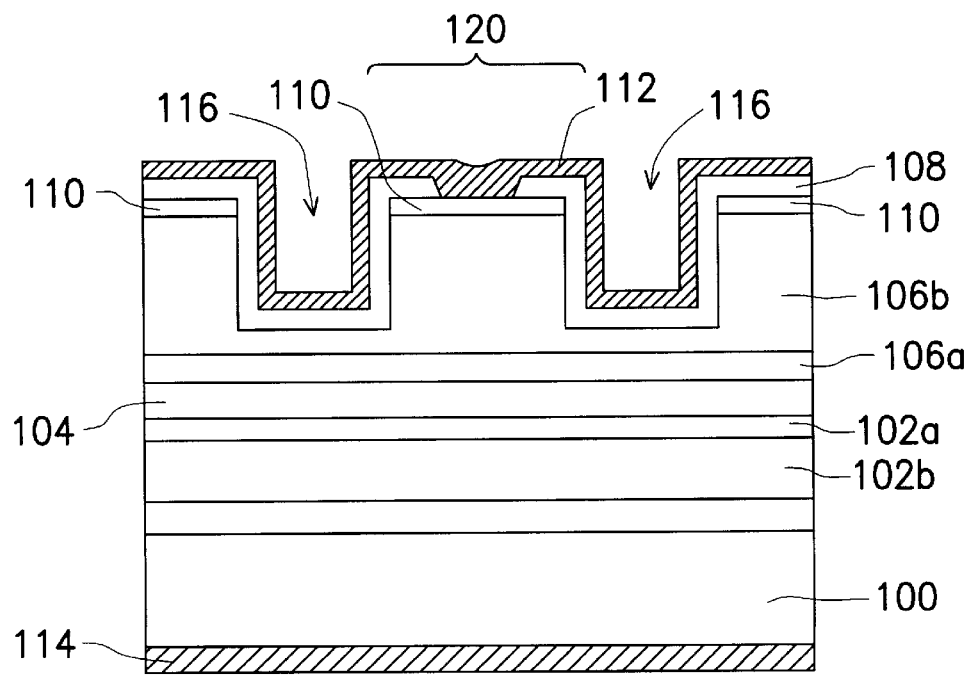
FIG. 1B is a cross-sectional view showing a portion of a common double-channel ridge-waveguide semiconductor laser diode.
Figure 2:
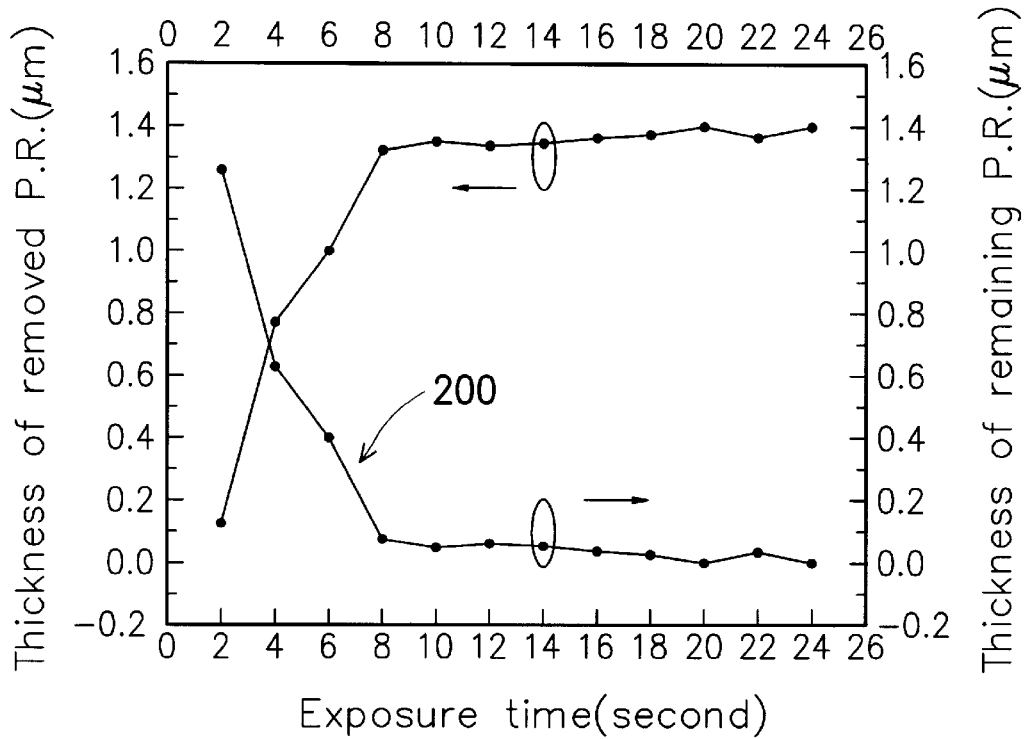
FIG. 2 is a relational plot showing the relationship between the thickness of a photoresist via the exposure time.
Figure 3:
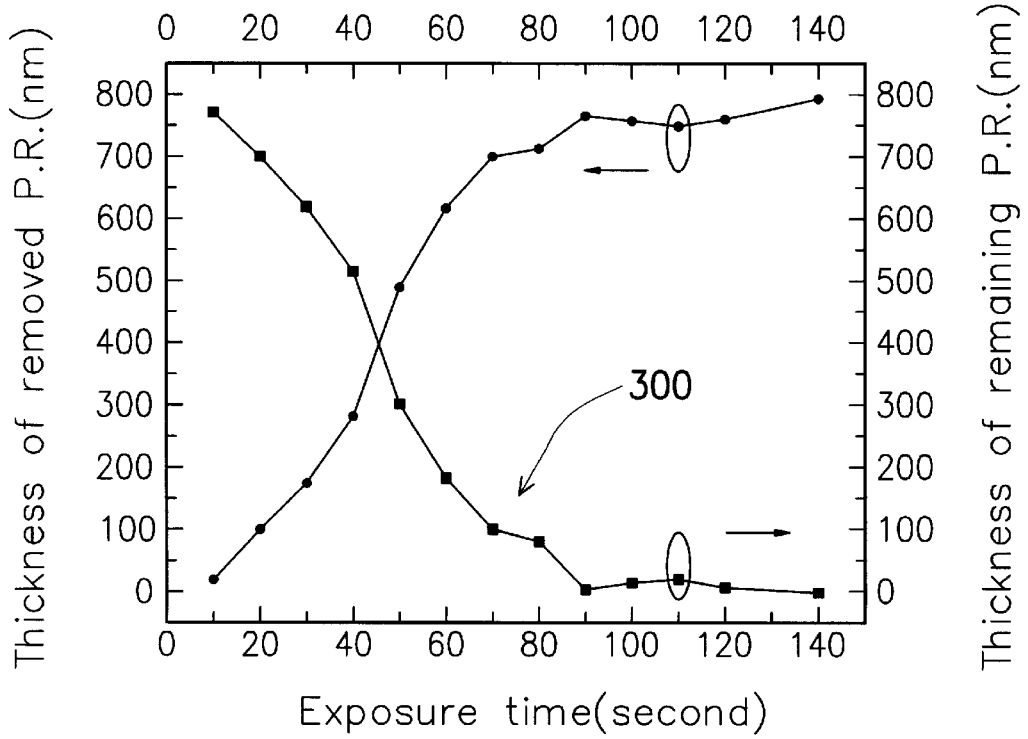
FIG. 3 is a relational plot showing the relationship between the thickness of another photoresist via the exposure time.
Figure 4A:
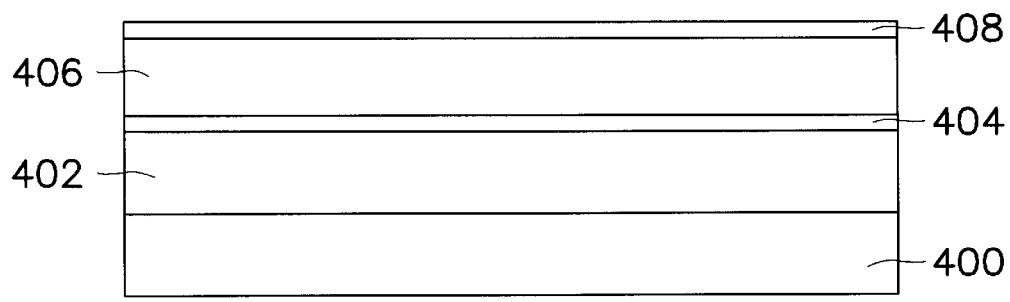
FIGS. 4A through 4O are cross-sectional views showing the method of a preferred embodiment according to the invention.
Figure 4B:
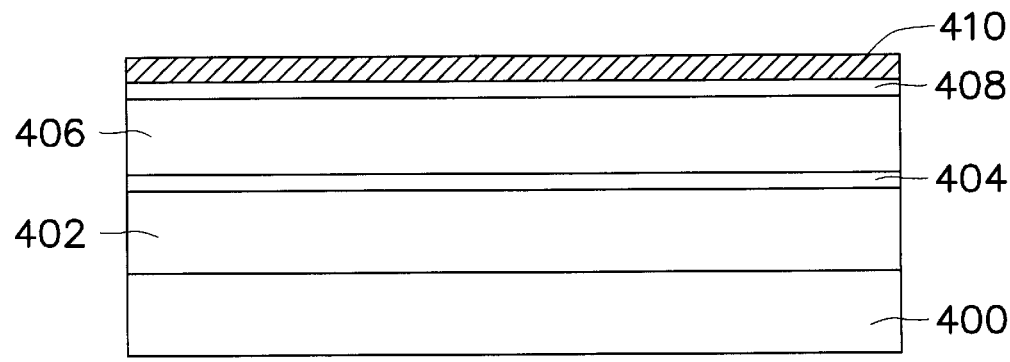
Figure 4C:
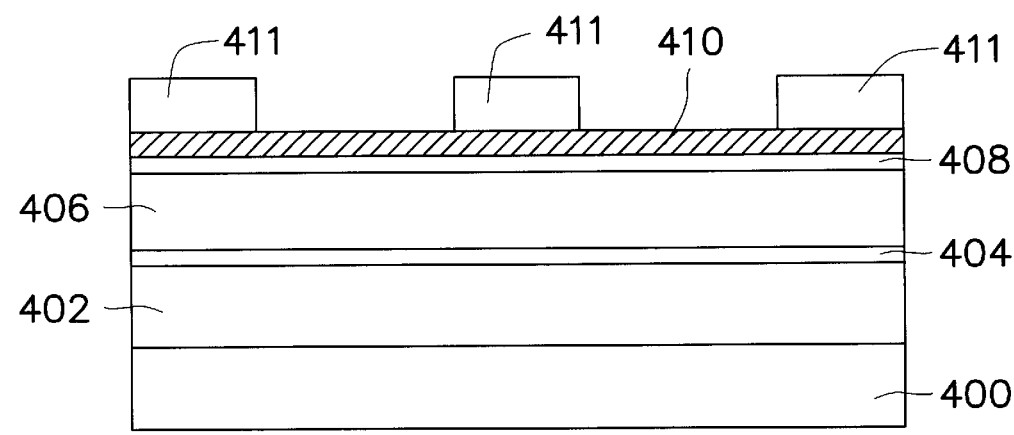
Figure 4D:
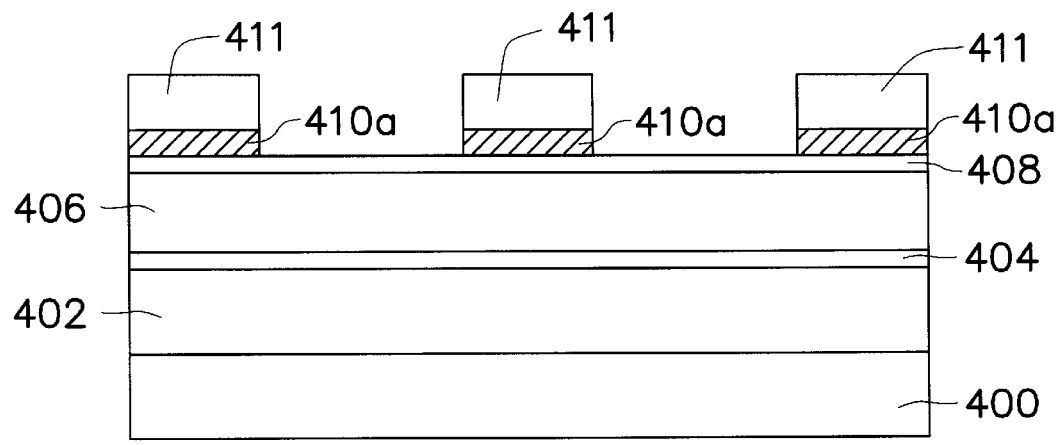
Figure 4E:
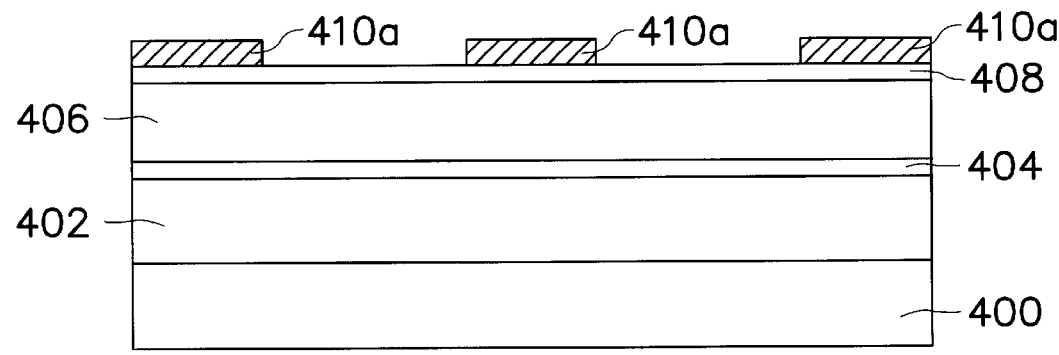
Figure 4F:
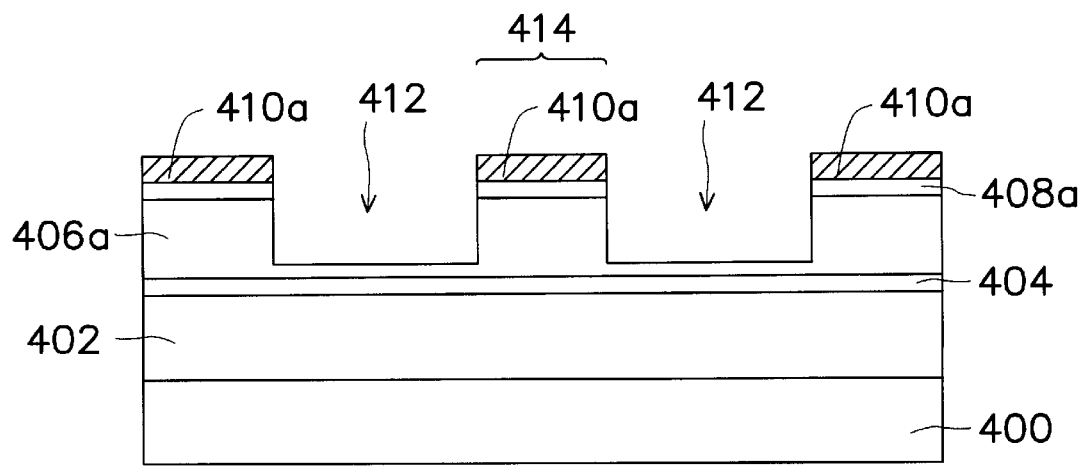
Figure 4G:
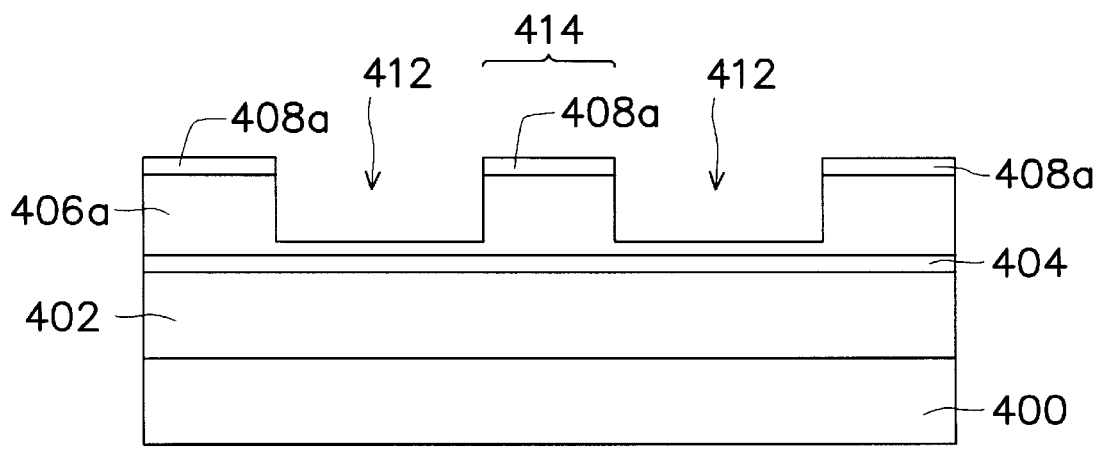
Figure 4H:
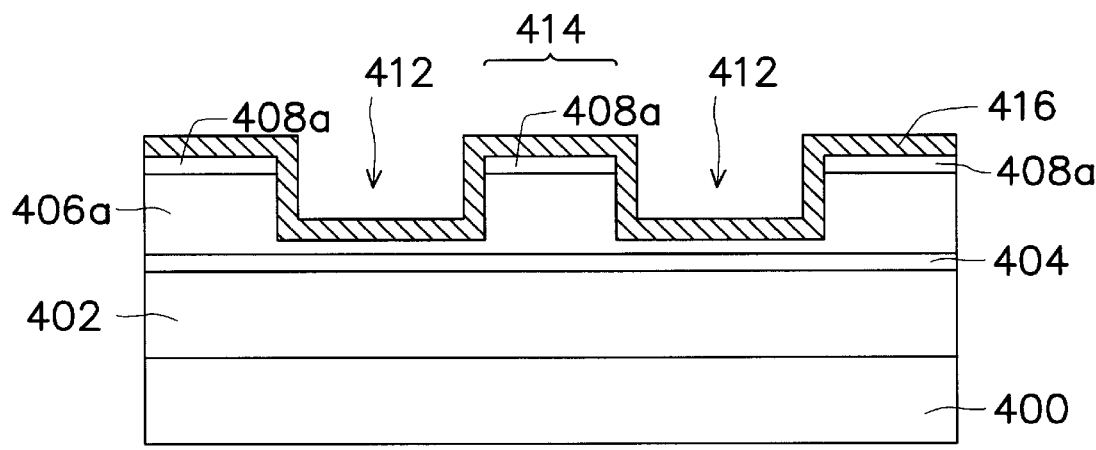
Figure 4I:
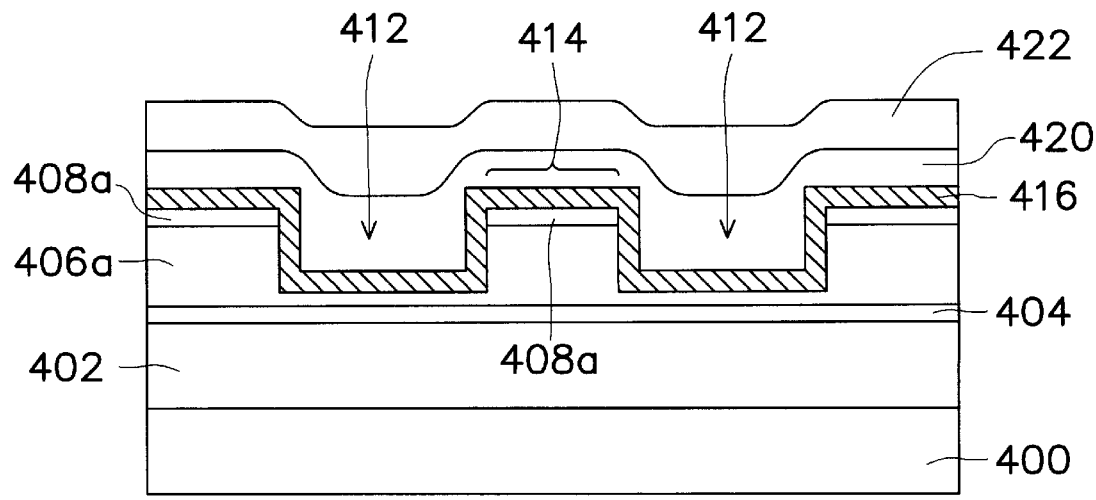
Figure 4J:
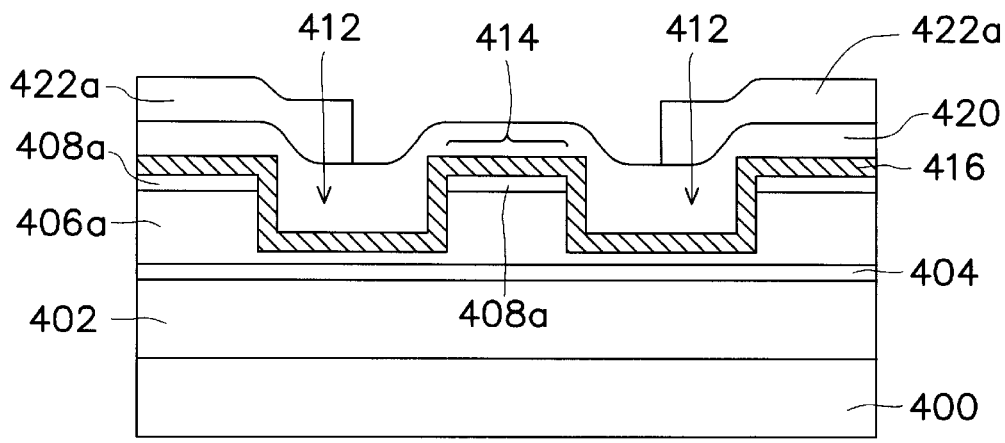
Figure 4K:
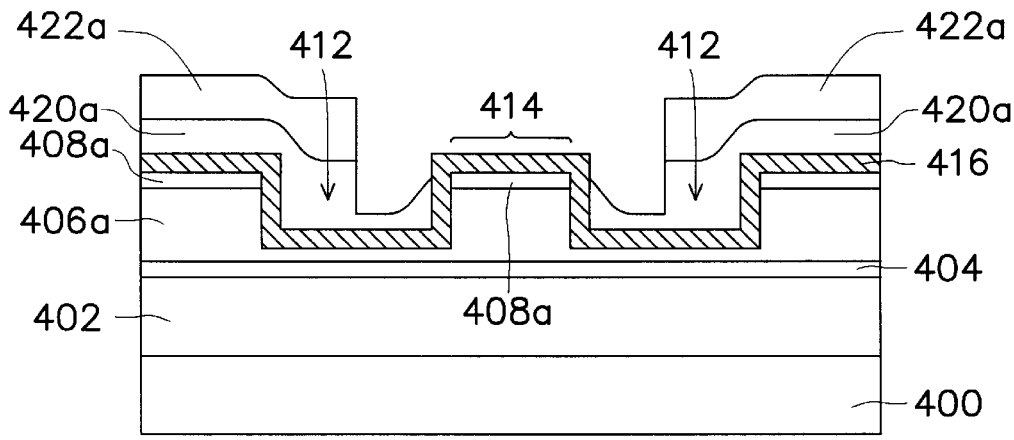
Figure 4L:
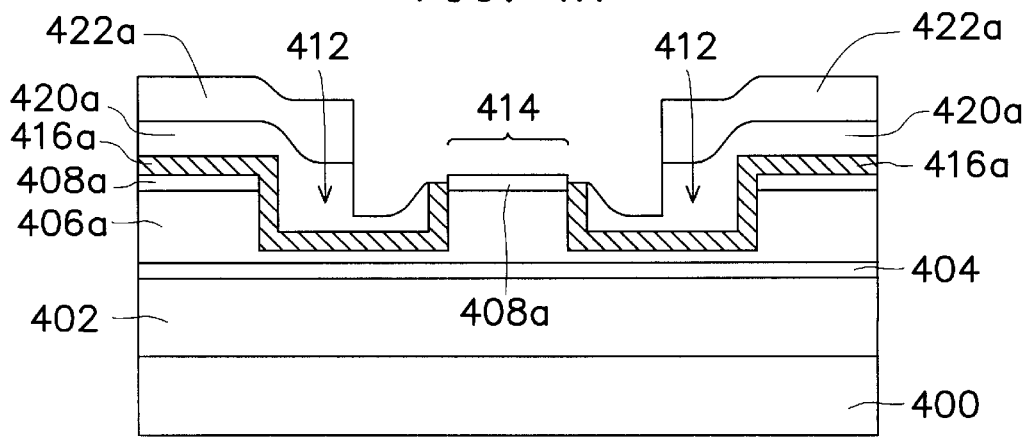
Figure 4M:
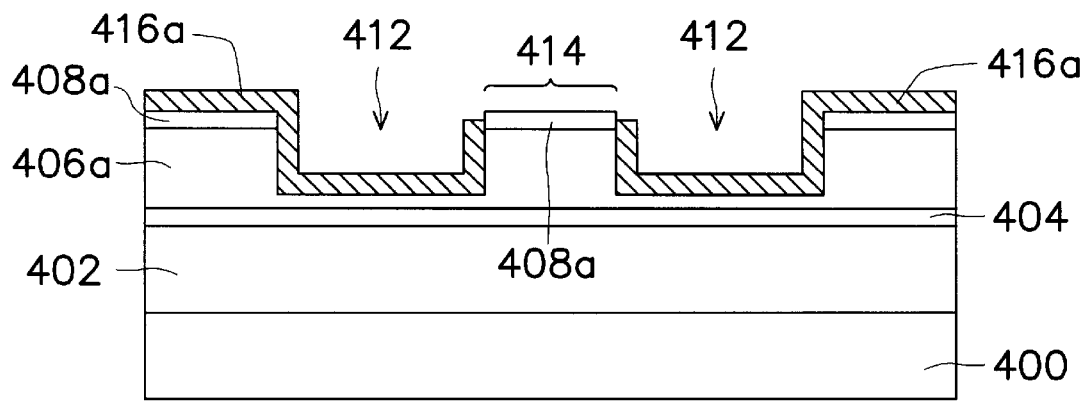
Figure 4N:
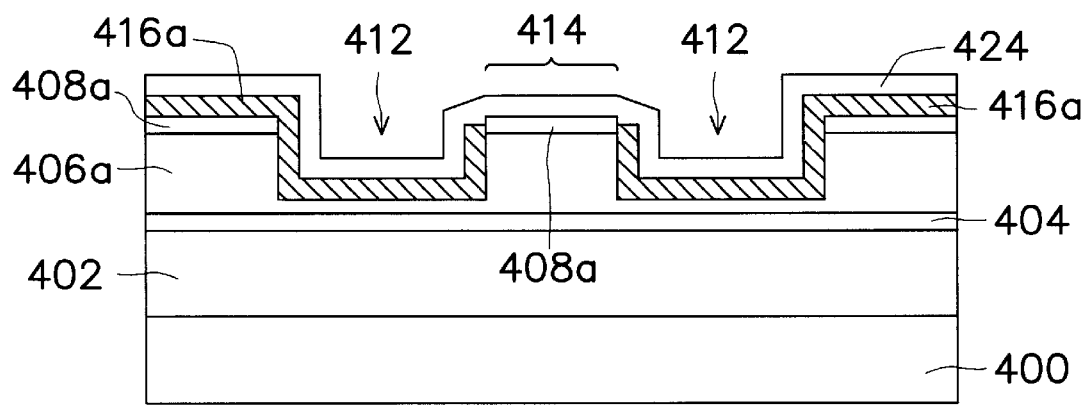
Figure 4O:
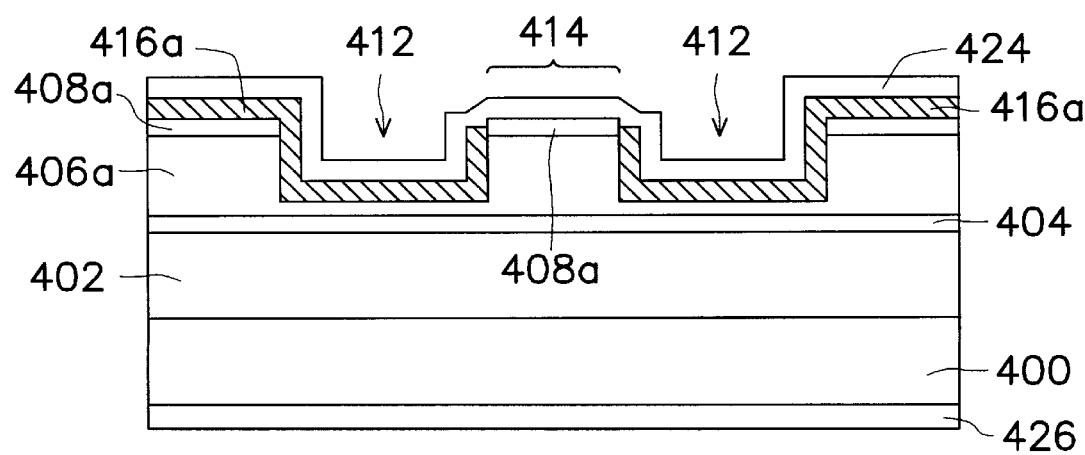

Two preferred embodiments are described below to further explain the method of the invention. The first embodiment:

FIGS. 4A through 4O are cross-sectional views of a portion of a ridge-waveguide semiconductor laser diode, showing the self-aligned method for fabricating a ridge-waveguide semiconductor laser diode in the first preferred embodiment according to the invention.

Referring to FIG. 4A, an N-type first cladding and waveguiding layer 402 is formed on a substrate of a first type 400, such as an N-type InP substrate. An active layer 404 is formed on the cladding and waveguiding layer 402. Then, a second cladding and waveguiding layer of a second type (P-type) 406 is formed on the active layer 404. Then a cap layer 408 is formed on the top of the second cladding and waveguiding layer 406, wherein the cap layer is P-type doped semiconductor.

Next, referring to FIG. 4B, a first dielectric layer 410, such as silicon nitride ($SiN_X$) is deposited on the foregoing structure by a plasma enhanced chemical vapor deposition process (PECVD). Referring to FIG. 4C, a patterned photoresist layer 411 is formed on the first dielectric layer 410 by performing a photolithography process. As shown in FIG. 4D, a portion of the first dielectric layer 410 is removed by performing a RIE process while using the patterned photoresist layer 411 as a mask. The RIE process is performed by using $SF_6$ at 25 standard cubic centimeters per minute (sccm), 50 mTorr and 20 W power for 2.2 minutes. Then, by sinking the wafer into acetone and using an ultrasonic waveguide structure, the photoresist layer 411 is removed. The wafer is cleaned with deionized water and dried by nitrogen. The patterned dielectric layer 410a is used as a mask in the follow-up process, as shown in FIG. 4E.

Referring to FIG. 4F, a etching process is performed on the cap layer 408 to remove the cap layer 408 and a part of the second cladding and waveguiding layer 406, wherein the remains of the second cladding and waveguiding layer have a predetermined thickness. The etching process includes using 20 sccm of $CH_4$ and 100 sccm of $H_2$, at 50 mTorr and 150 W power for 10 minutes. Since the etching process generates polymer, 50 sccm of $O_2$ at 100 mTorr and 50 W power for 5 minutes is used to remove the polymer. The foregoing etching processes need to be repeated twice to form the double channel 412 to a depth of about 1.4 $\mu$m and the ridge structure 414.

Referring next to FIG. 4G, the patterned first dielectric layer 410a, $SiN_X$, is removed by using a buffered oxide etchant (BOE). The wafer needs to be cleaned by deionized water and dried by nitrogen gas after the patterned dielectric layer is removed. Referring to FIG. 4H, a second dielectric layer 416 is formed on the substrate 400, wherein the formation of the second dielectric layer 416 is the same as that of the first dielectric layer 410.

As shown in FIG. 4I, a first photoresist layer 420 and a second photoresist layer 422 are formed on the substrate 400, wherein the first photoresist layer 420 includes ODUR1013 and the second photoresist layer 422 includes AZ5214E. Photoresist ODUR1013 only reacts with light having a wavelength less 300 nm, and photoresist AZ5214E only reacts with light having a wavelength longer than 300 nm.

Referring to FIG. 4J, a G-line mask aligner is used on the substrate 400. Because the first photoresist 420 doesn't react with light having a wavelength longer than 300 nm, only the second photoresist layer 422 is patterned to expose the first photoresist layer 420. The remains of the second photoresist layer 422a can be further used as a protective structure to prevent the peripheral devices from being damaged by the follow-up processes.

Referring next to FIG. 4K, a RIE process is performed on the first photoresist layer 420 to expose the second dielectric layer 416 on the top of the ridge structure 414. The remains of the first photoresist layer 420a provide protection to the second dielectric layer 416 on the sidewalls of the ridge structure 414. The RIE process includes using 25 sccm $O_2$ at 50 mTorr and 20 W power for three minutes.

Referring to FIG. 4L, an etching process is performed to remove a portion of the second dielectric layer 416 outside the ridge 414. The etching process includes a RIE process, the same as the one used to remove the first dielectric layer 410, and includes using 25 sccm $SF_6$ at 50 mTorr and 20 W power for 2.2 minutes.

The remains of the first and the second photoresist layers 420a and 422a are now removed by using acetone., as shown in FIG. 4M.

Referring to FIG. 4N, a first metal layer 424 is formed on the entire substrate 400 as an electrode by an evaporation process, wherein the first metal layer 424 includes a P-type metal consisting of Ti/Pt/Au with thickness of 100 Å/2000 Å/2000 Å.

According to the foregoing, the first metal layer 424 is in direct contact with the second dielectric layer 416a and the top of the cap layer 408a, therefore, the property of the device is improved because of the excellent conductivity between the metal layer and the ridge structure.

Figure 5A:
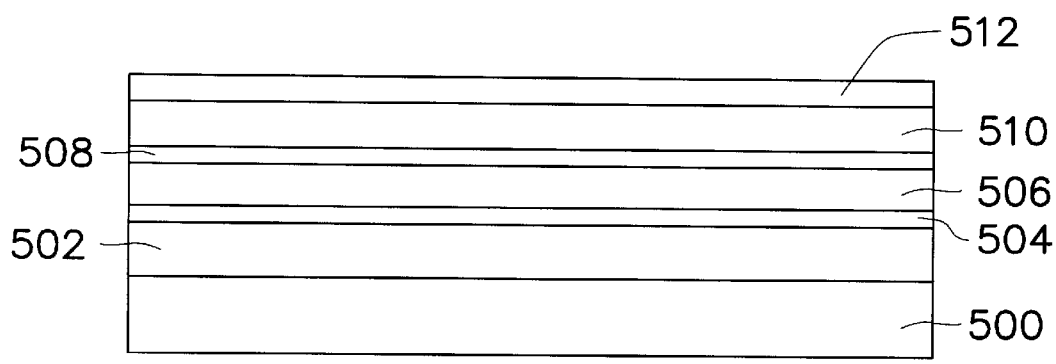
FIGS. 5A through 5P are cross-sectional views showing the method of another preferred embodiment according to the invention.
Figure 5B:
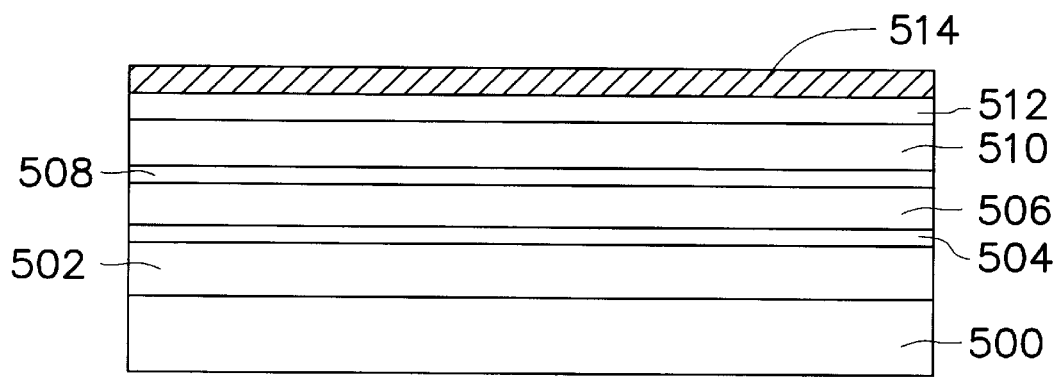
Figure 5C:
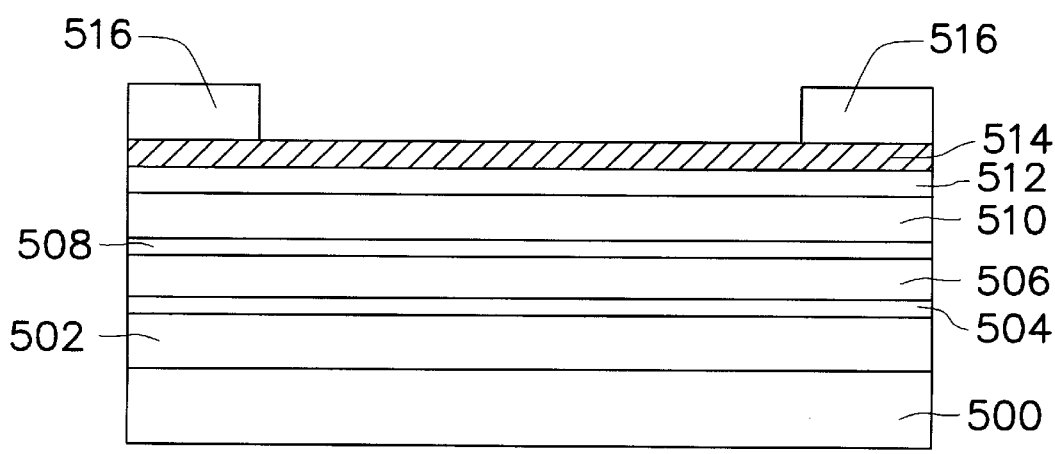
Figure 5D:
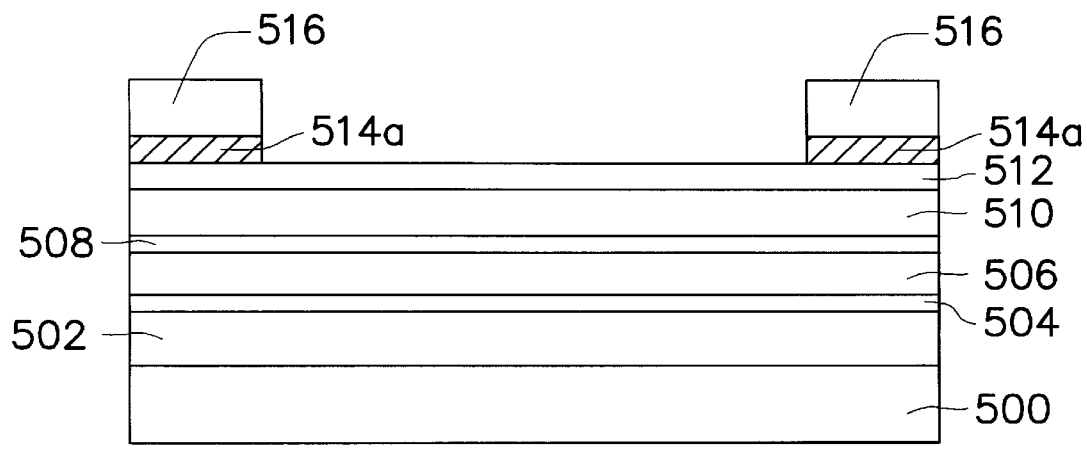
Figure 5E:
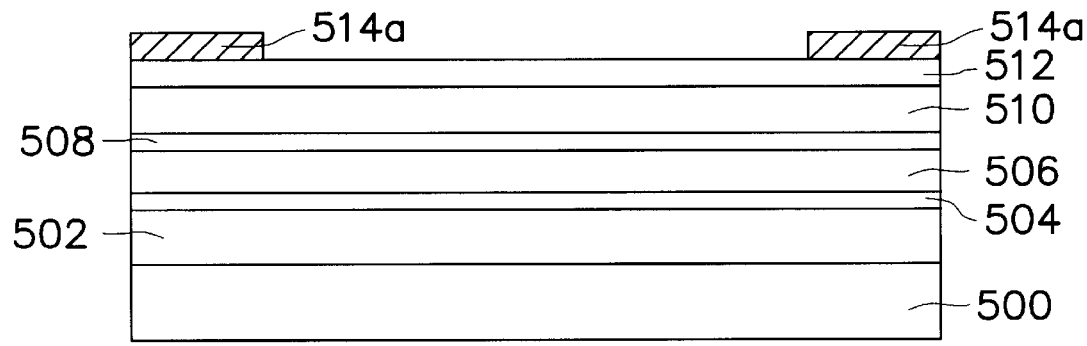
Figure 5F:
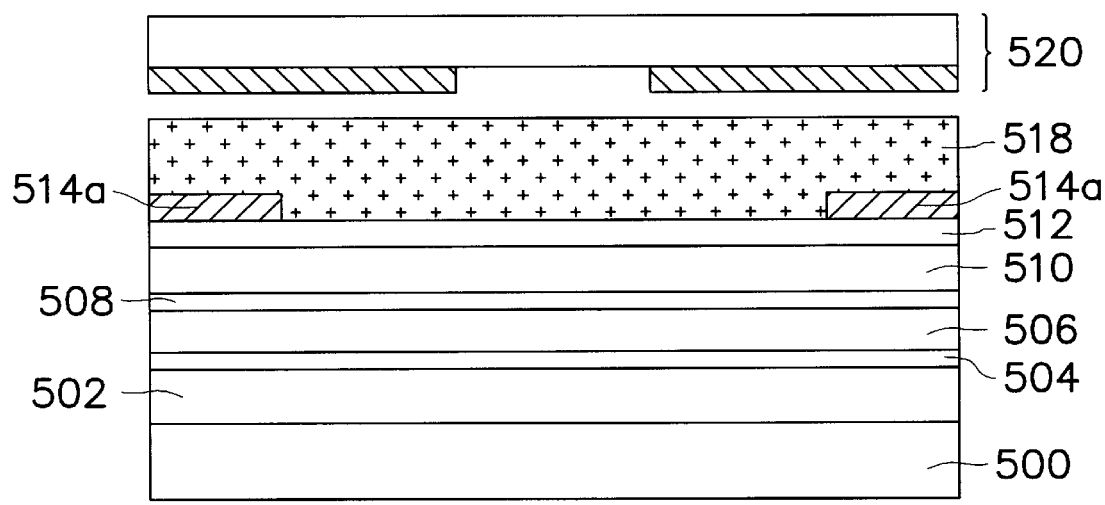
Figure 5G:
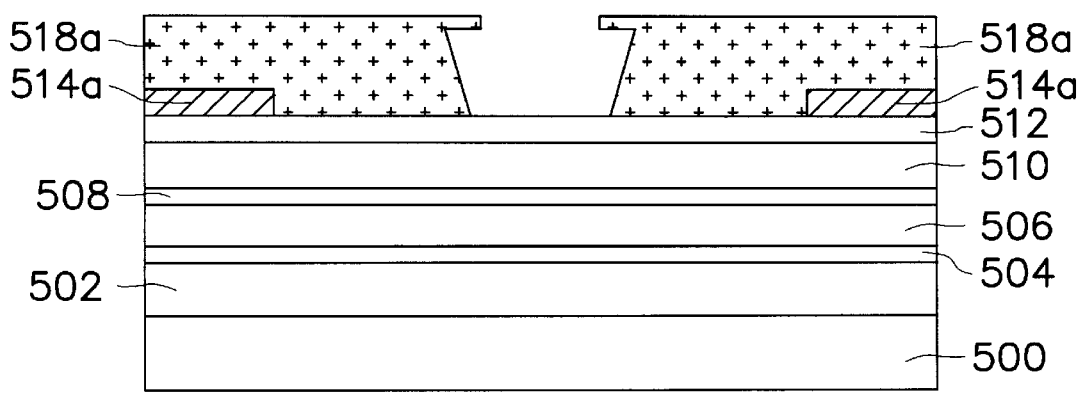
Figure 5H:
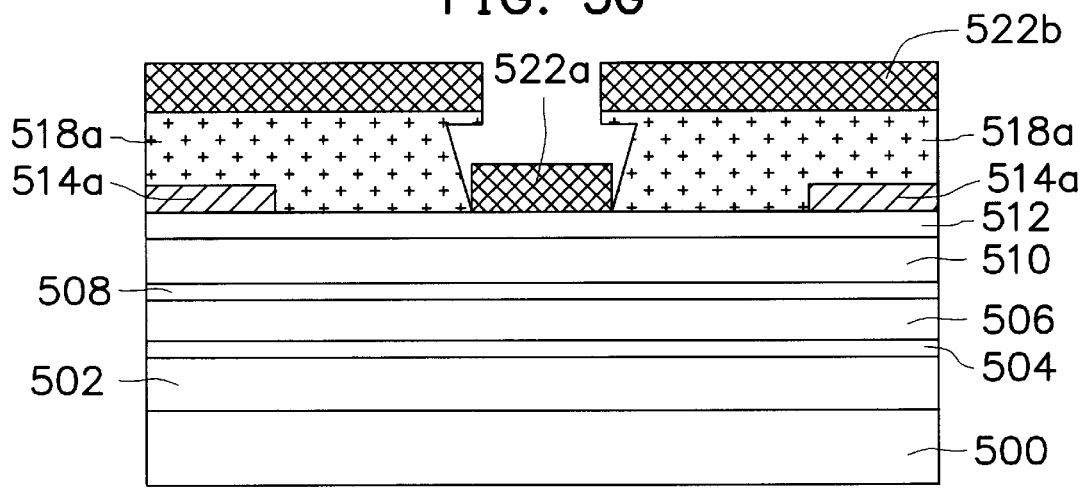
Figure 5I:
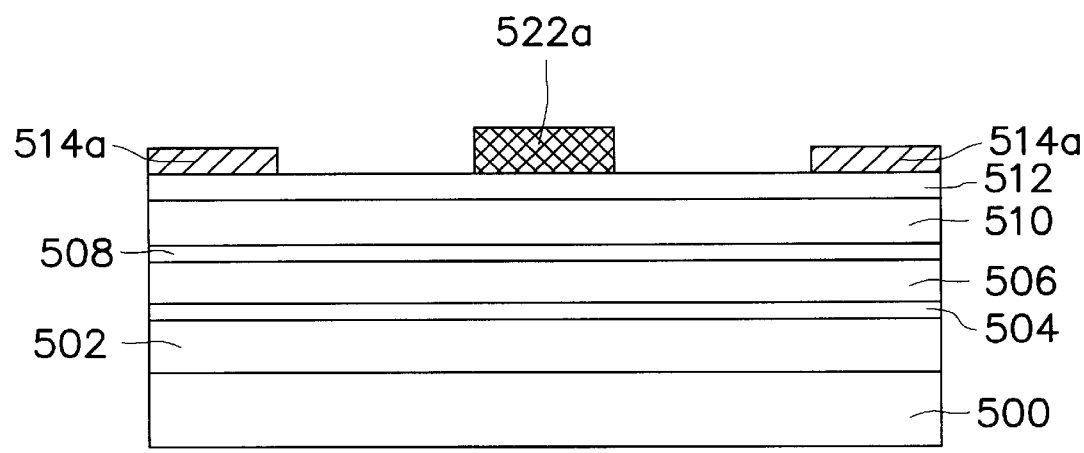
Figure 5J:
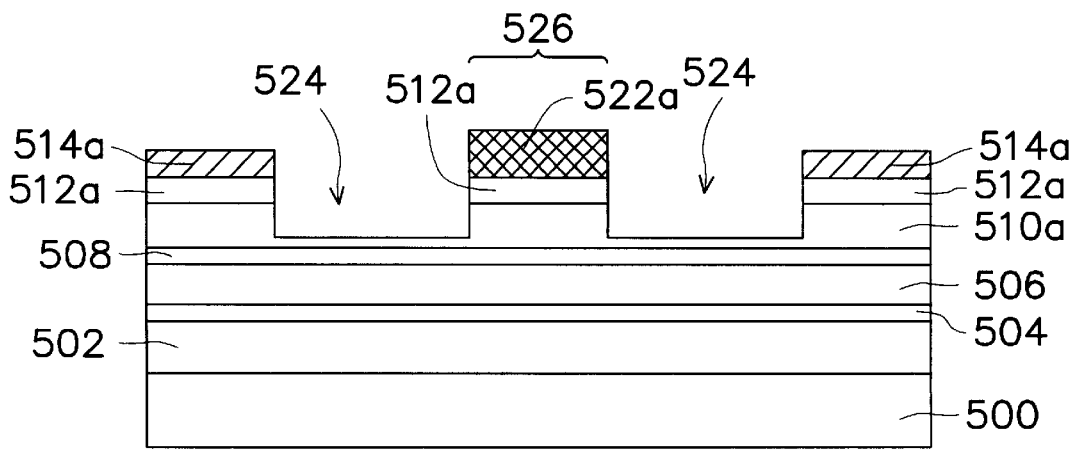
Figure 5K:
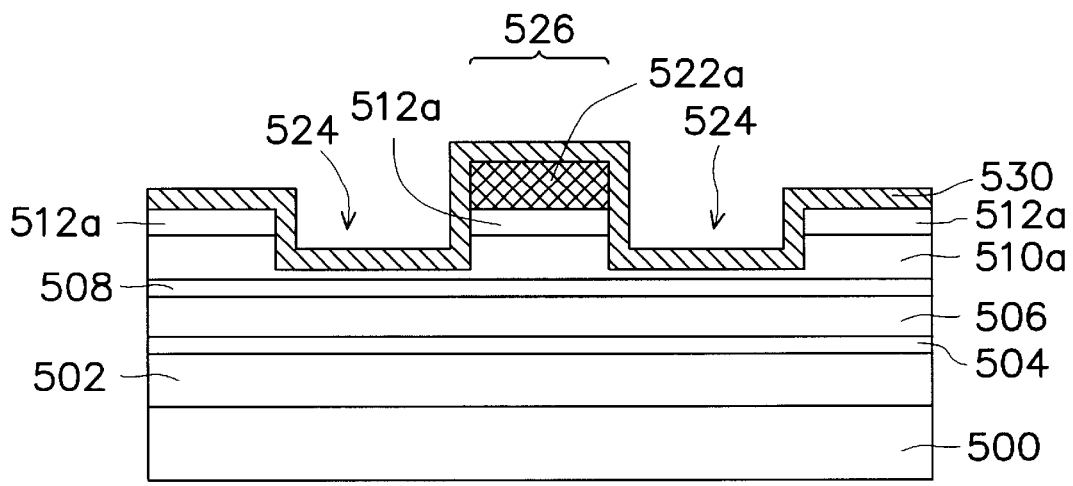
Figure 5L:
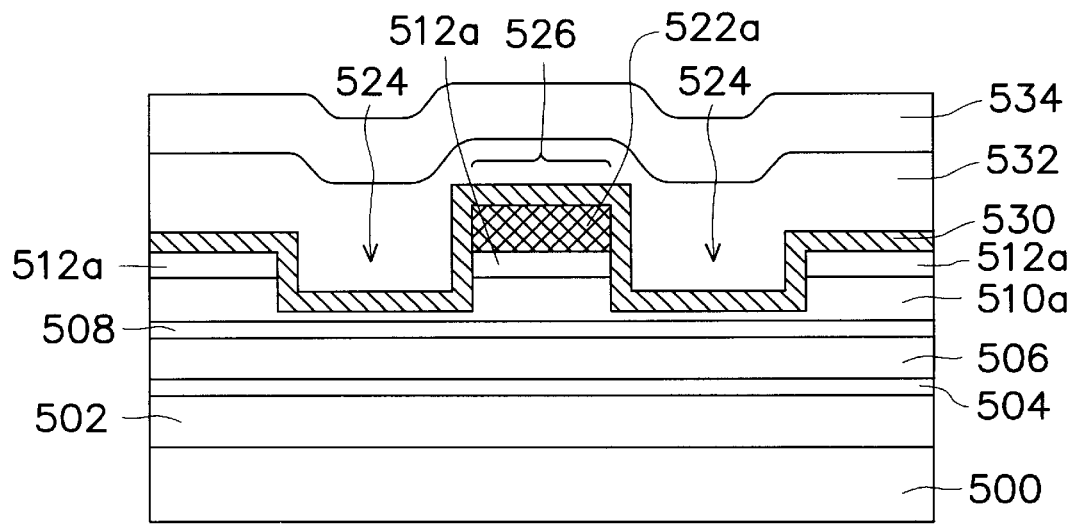
Figure 5M:
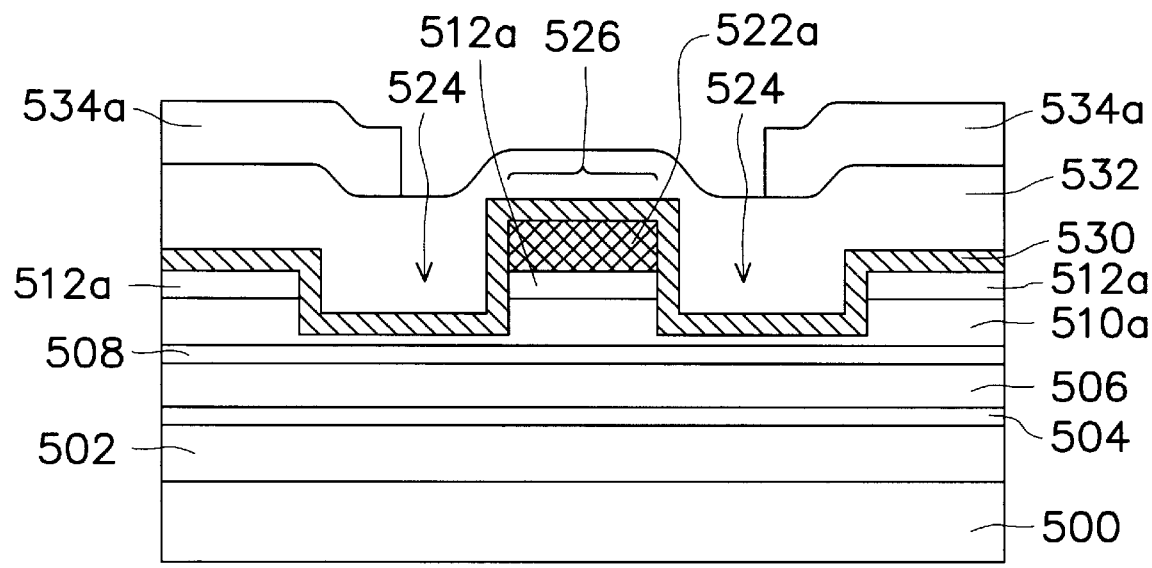
Figure 5N:
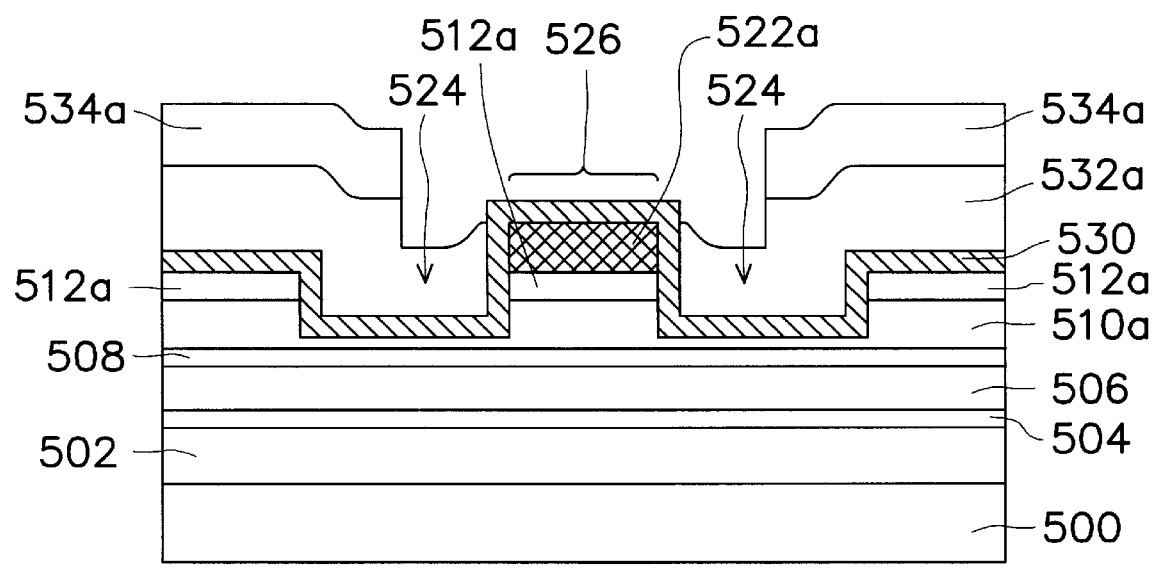
Figure 5O:
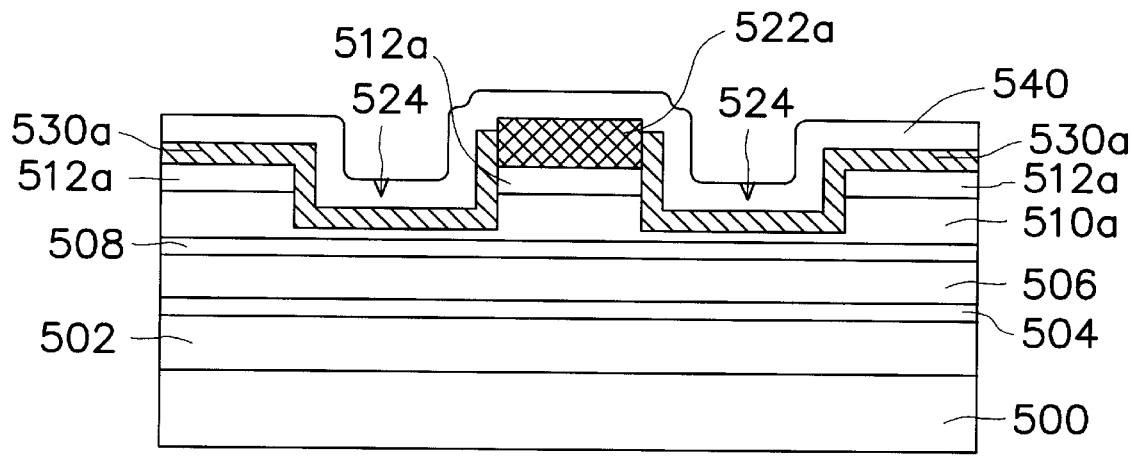
Figure 5P:
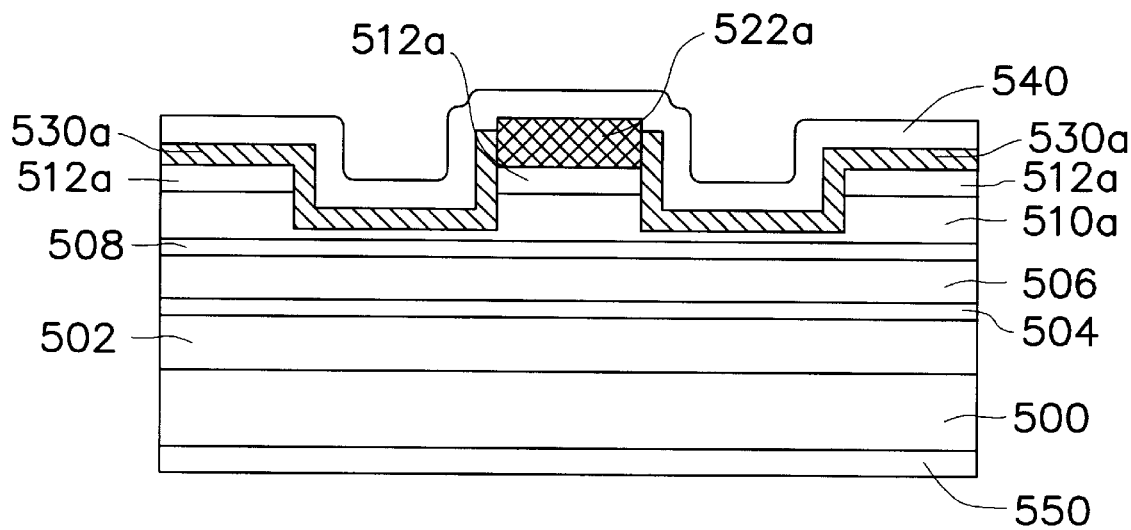

Also referring to FIG. 4O, a second metal layer 426 is formed on the bottom of the substrate 400 by an evaporation process as an electrode after a planarization process is performed on the bottom of the substrate 400. The metal layer includes N-type metal consisting of AuGe/Ni/Au with thickness of 500 Å/200 Å/3500 Å. A rapid thermal annealing process at about 380° C. for 20 seconds can further improve an excellent N-type Ohmic contact on the interface. The second embodiment:

Another embodiment of the invention, a self-aligned method for fabricating a ridge-waveguide semiconductor laser diode, is shown in FIGS. 5A through 5P.

Referring to FIG. 5A, a first waveguide layer 502 is formed on a provided substrate 500 of a first type, such as a N-type InP substrate, and a first cladding layer 504 is formed on the waveguide layer 502. Then, a active layer 506, a second cladding layer 508, a second waveguide layer 510, such as a P-type waveguide layer, and a cap layer 512 are formed on the substrate 500 in sequence, wherein the cap layer 512 includes a $P^+$-type doped semiconductor.

Referring next to FIG. 5B, a dielectric, silicon nitride, $SiN_X$, layer 514 is formed over the substrate 500 by a PECVD process.

Next, referring to FIG. 5C, a patterned photoresist layer 516 is formed over the substrate 500 as a mask to perform an etching process on the first dielectric layer 514. As shown in FIG. 5D, a portion of the first dielectric layer 514 is removed by the etching process, wherein the etching process includes using 25 sccm $SF_6$ at 50 mTorr and 20 W power for 2.2 minutes. Then, by immersing the wafer in acetone and using an ultrasonic waveguide structure, the photoresist layer 516 is removed. The wafer is cleaned with deionized water and dried by nitrogen. The patterned dielectric layer 514a is used to be a mask in the follow-up process, as shown in FIG. 5E.

Referring to FIG. 5F, a photoresist layer 518 is formed on the cap layer 512, and a chromium mask 520 is placed on the photoresist layer 518 to pattern the photoresist layer 518, as shown in FIG. 5G. Referring to FIG. 5H, first metal layers 522a and 522b are formed on top of the cap layer 512 and the patterned photoresist layer 518a, respectively. Then, by performing a lift-off process, the patterned photoresist layer 518a and the metal layer 522b are removed, resulting in the structure shown in FIG. 5I. Because the metal layer 522a formed by the method according to the invention has excellent ohmic contact with the cap layer 512, the performance of the device is improved.

Next, as shown in FIG. 5I, a RIE process is performed on a portion of the cap layer 512 that is not covered by the metal layer 522a and the dielectric layer 514a. A portion of the cap layer 512 and some of the second cladding layer 510 underneath the cap layer 512 are removed, wherein the remains of the second cladding layer 510a have a desired thickness, as shown in FIG. 5J. A ridge structure 526 and a double-channel structure 524 of a ridge-waveguide semiconductor laser diode are now formed. The patterned first dielectric layer 514a, $SiN_x$, is removed by using a buffered oxide etchant. The wafer also needs to be cleaned with deionized water and dried by nitrogen gas after the patterned dielectric layer is removed.

Referring to FIG. 5K, a second dielectric layer 530 is formed over the substrate 500, wherein the formation of the second dielectric layer 530 is the same as that of the first dielectric layer 514.

As shown in FIG. 5L, a first photoresist layer 532 and a second photoresist layer 534 are formed on the substrate 500, wherein the first photoresist layer 532 includes ODUR1013 and the second photoresist layer 534 includes AZ5214E. Photoresist ODUR1013 only reacts with light of wavelength less 300 nm, and, on the other hand, photoresist AZ5214E only reacts with light of a wavelength longer than 300 nm.

Referring to FIG. 5M, a G-line mask aligner is used on the substrate 500. Because the first photoresist 532 doesn't react with light of a wavelength longer than 300 nm, only the second photoresist layer 534 is patterned to expose the first photoresist layer 532. The remains of the second photoresist layer 534a can be further used as protection to prevent the peripheral devices from being damaged by the follow-up processes.

Referring next to FIG. 5N, a RIE process is performed on the first photoresist layer 532 to expose the second dielectric layer 530 on the top of the ridge structure 526. The remains of the first photoresist layer 532a provide protection to the second dielectric layer 530 outside the ridge 526. The RIE process includes using 25 sccm $O_2$ at 50 mTorr and 20 W power for three minutes.

Referring to FIG. 5O, an etching process is performed to remove the a portion of the second dielectric layer 530 outside the ridge structure 526 to expose the first metal layer 522a. The etching process includes a RIE process that includes using 25 sccm $SF_6$ at 50 mTorr and 20 W power for 2.2 minutes.

According to the foregoing process, since the first photoresist layer 532 is removed by a RIE process, the etching process is controllable and only a portion of the first photoresist layer located on the top of the first metal layer 522a is removed. The over-etching problem, as seen in a conventional method that removes the photoresist layer located in the channel and exposes the sidewalls of the ridge structure, is resolved.

Referring to FIG. 5O, a second metal layer 540 is formed on the second dielectric layer 530a and the first metal layer 522a for wiring, wherein the second metal layer 640 includes Ti/Au with thickness of about 300 Å/4000 Å by an evaporation process.

Next, as shown in FIG. 5P, a third metal layer 550 is formed on the bottom surface of the substrate 500 as an electrode after a planarization process is performed on the bottom surface of the substrate 500. The third metal layer 550 includes AuGe/Ni/Au with thickness of about 500 Å/200 Å/3500 Å formed by an evaporation process. A thermal process can be performed after the third metal layer is formed to provide a better N-type contact at the interface, wherein the thermal process includes heating the substrate to 380° C., for a period of 20 seconds, and then cooling it down.

Therefore, it is a specificity of the invention to provide a self-aligned method for fabricating a ridge-waveguide laser diode, wherein the method includes forming two back-to-back photoresist layers on the substrate, and the two photoresist layers each react to a different light source.

It is another specificity of the invention to provide a self-aligned method for fabricating a ridge-waveguide laser diode that includes using a RIE process to expose the dielectric layer located on the top of the ridge structure. Because the photoresist etching rate of the RIE process can be well controlled at a rate of about 1000 Å/mintue, the etching process is more uniform and more precise than the previous process used is a conventional method. The region outside the ridge structure can be well protected by the first photoresist layer, so the process yield is improved.

It is still another specificity of the invention to provide a self-aligned method for fabricating a ridge-waveguide laser diode that ensures that the metal layer has excellent coverage on the cap layer to improve the ohmic contact and cooling, and hence, to improve the performance of the device.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A self-aligned method for fabricating a ridge-waveguide semiconductor laser diode, the method comprising:

forming a first cladding and waveguiding layer on a semiconductor substrate;

forming an active layer on the first cladding and waveguiding layer;

forming a second cladding and waveguiding layer on the active layer;

forming a cap layer on the second cladding and waveguiding layer;

forming and patterning a first dielectric layer on the cap layer;

forming a double channel and a ridge structure by performing an etching process and using the patterned first dielectric layer as a mask;

removing the first dielectric layer;

forming a second dielectric layer on the substrate to cover the double channel and the ridge structure;

forming a first photoresist layer on the second dielectric layer;

forming a second photoresist layer on the first photoresist layer, wherein the second photoresist reacts with a light;

exposing and developing the second photoresist layer by the light of a wavelength with which the first photoresist layer cannot react with to form an opening in the second photoresist layer right on the ridge structure and expose the first photoresist layer on the ridge structure;

removing the first photoresist layer by using the second photoresist layer as a mask to expose the second dielectric layer on the ridge structure, wherein remains of the first photoresist layer are located on the sidewalls of the ridge structure and the double channel;

removing the exposed second dielectric layer to expose the cap layer;

removing the remains of the first photoresist layer and the second photoresist layer to expose the remaining second dielectric layer and the cap layer;

forming a first metal layer on the remaining second dielectric layer and the exposed cap layer located on top of the ridge structure, wherein the first metal layer is a first electrode; and forming a second metal layer on the opposite surface of the substrate as a second electrode.

2. The method of claim 1, wherein the semiconductor substrate includes an N-type substrate.

3. The method of claim 1, wherein the cap layer includes a P-type semiconductor.

4. The method of claim 1 wherein the first dielectric layer and the second dielectric layer include $SiN_x$.

5. The method of claim 1, wherein the first dielectric layer and the second dielectric layer are formed by performing a plasma enhanced vapor deposition process.

6. The method of claim 1, wherein the first dielectric layer is about 2500 Å thick.

7. The method of claim 1 wherein the first dielectric layer is removed by using a buffered oxide etchant.

8. The method of claim 1, wherein the double channel is formed by performing a reactive ion etching (RIE) process, wherein the RIE process stops when depth of the double channel reaches a desired value.

9. The method of claim 1, wherein the first photoresist layer includes ODUR1013, and the second photoresist layer includes AZ5214E.

10. The method of claim 9, wherein wavelength of the light is greater than 300 nm.

11. The method of claim 1, wherein the first photoresist layer includes AZ5214E, and the second photoresist layer includes ODUR1013.

12. The method of claim 11, wherein wavelength of the light is less than 300 nm.

13. The method of claim 1, wherein the step of removing the first photoresist layer to expose the second dielectric layer includes a RIE process.

14. The method of claim 1, wherein the first photoresist layer and the second photoresist layer are removed by an ultrasonic waveguide structure.

15. The method of claim 1, wherein the first metal layer and the second metal layer are formed by an evaporation process.

16. The method of claim 1, wherein the first metal layer includes P-type Ti, Pt and Au.

17. The method of claim 16, wherein the P-type Ti, Pt and Au have thickness of about 100 Å, 2000 Å and 2000 Å, respectively.

18. The method of claim 1, wherein the second metal layer includes N-type AuGe, Ni and Au.

19. The method of claim 18, wherein the N-type AuGe, Ni and Au have thickness of about 500 Å, 200 Å and 3500 Å.

20. A self-aligned method for fabricating a ridge-waveguide semiconductor laser diode, the method comprising:

forming a first cladding layer on a semiconductor substrate;

forming a first waveguiding layer on the first cladding layer;

forming an active layer on the first waveguiding layer;

forming a second waveguiding layer on the active layer;

forming a second cladding layer on the second waveguiding layer;

forming a cap layer on the second cladding layer;

forming and patterning a first dielectric layer on the cap layer, wherein a portion of the cap layer is exposed between the patterned first dielectric layer;

forming a first metal layer on a portion of the exposed cap layer, wherein the first metal layer has ohmic contact with the cap layer;

forming a double channel and a ridge structure by performing an etching process on the cap layer and the second waveguiding layer using the patterned first dielectric layer and the first metal layer as a mask;

removing the first dielectric layer to exposed the underlying cap layer, while a portion of the cap layer on top of the ridge structure covered by the first metal layer is remained;

forming a second dielectric layer on the substrate to cover the double channel and the ridge structure;

forming a first photoresist layer on the second dielectric layer;

forming a second photoresist layer on the first photoresist layer, wherein the second photoresist reacts with a light with a wavelength that the first phosoresist layer cannot be exposed and developed thereby;

exposing and developing the second photoresist layer by the light to form an opening right on the ridge structure and expose the first photoresist layer;

removing the first photoresist layer by using the second photoresist layer as a mask to expose only the portion of the second dielectric layer on the ridge structure, wherein remains of the first photoresist layer are located on the sidewalls of the ridge structure and the double channel;

removing the exposed second dielectric layer to expose the first metal layer;

removing the remains of the first photoresist layer and the second photoresist layer;

forming a second metal layer on the second dielectric layer and the exposed cap layer located on top of the ridge structure, wherein the first metal layer is a first electrode; and forming a third metal layer on a bottom surface of the substrate as a second electrode.

21. The method of claim 20, wherein the semiconductor substrate includes an N-type substrate.

22. The method of claim 20, wherein the cap layer includes a P-type semiconductor.

23. The method of claim 20, wherein the first dielectric layer and the second dielectric layer include $SiN_x$.

24. The method of claim 20, wherein the first dielectric layer and the second dielectric layer are formed by performing a plasma enhanced vapor deposition process.

25. The method of claim 20, wherein the first dielectric layer is 2500 Å thick.

26. The method of claim 20, wherein the first dielectric layer is removed by using a buffered oxide etchant.

27. The method of claim 20, wherein the double channel is formed by performing a reactive ion etching (RIE) process, wherein the RIE process is stopped when depth of the double channel reaches a desired value.

28. The method of claim 20, wherein the first photoresist layer includes ODUR1013, and wherein the second photoresist layer includes AZ5214E.

29. The method of claim 28, wherein wavelength of the light is greater than 300 nm.

30. The method of claim 20, wherein the first photoresist layer includes AZ5214E, and the second photoresist layer includes ODUR1013.

31. The method of claim 30, wherein wavelength of the light is less than 300 nm.

32. The method of claim 20, wherein the step of removing the first photoresist layer to expose the second dielectric layer includes a RIE process.

33. The method of claim 20, wherein the first photoresist layer and the second photoresist layer are removed by an ultrasonic waveguide structure.

34. The method of claim 20, wherein the first metal layer and the second metal layer are formed by an evaporation process.

35. The method of claim 20, wherein the first metal layer includes P-type Ti, Pt and Au.

36. The method of claim 35, wherein Ti and Au are about 300 Å and 4000 Å thick.

37. The method of claim 20, wherein the second metal layer includes N-type AuGe, Ni and Au.

38. The method of claim 37, wherein the N-type AuGe, Ni and Au are about 500 Å, 200 Å and 3500 Å.

* * * * *